United States Patent
Vanysacker et al.

(10) Patent No.: US 8,143,700 B2
(45) Date of Patent: Mar. 27, 2012

(54) ELECTROSTATIC DISCHARGE PROTECTION CIRCUIT

(75) Inventors: Pieter Vanysacker, Gistel (BE); Benjamin Van Camp, Bruges (BE); Olivier Marichal, Nieuwerkerken (BE); Wybo Geert, Ghent (BE); Steven Thijs, Willebroek (BE); Gerd Vermont, Ruiselede (BE)

(73) Assignee: Sofics BVBA, Gistel (BE)

( * ) Notice: Subject to any disclaimer, the term of this patent is extended or adjusted under 35 U.S.C. 154(b) by 304 days.

(21) Appl. No.: 12/345,086

(22) Filed: Dec. 29, 2008

(65) Prior Publication Data

US 2009/0101938 A1 Apr. 23, 2009

Related U.S. Application Data

(62) Division of application No. 11/395,954, filed on Mar. 30, 2006, now abandoned.

(60) Provisional application No. 60/666,445, filed on Mar. 30, 2005.

(51) Int. Cl.
*H01L 27/02* (2006.01)

(52) U.S. Cl. ........ 257/546; 257/173; 257/107; 257/544; 257/E27.033

(58) Field of Classification Search .................. 257/173, 257/107, 546, 544, E27.033
See application file for complete search history.

(56) References Cited

U.S. PATENT DOCUMENTS

| 6,803,633 | B2 | 10/2004 | Mergens et al. |
| 7,113,377 | B2 | 9/2006 | Salome et al. |
| 2002/0041007 | A1* | 4/2002 | Russ ............................ 257/546 |

OTHER PUBLICATIONS

Caillard, B. et al., STMSCR: A new Multi-Finger SCR-Based Protection Structure Against ESD, 2003 EOS/ESD Symposium.
Caillard, B. et al., Le Thyristor Parasite en technologie CMOS: Application a la Protection contre les Decharges Electrostatiques, THESE, Oct. 27, 2003.

* cited by examiner

*Primary Examiner* — Tan N Tran
(74) *Attorney, Agent, or Firm* — Volpe and Koenig P.C.

(57) ABSTRACT

The present invention provides an electrostatic discharge (ESD) protection circuit with a silicon controlled rectifier (SCR) having a plurality of SCR fingers (SCRs) with the advantages to couple the different fingers or SCRs to decrease the multi-triggering problem and to increase the ESD-performance of the circuit. Additionally, a boost circuit can be introduced or additionally multiple SCRs can be coupled inherent through a common base.

30 Claims, 11 Drawing Sheets

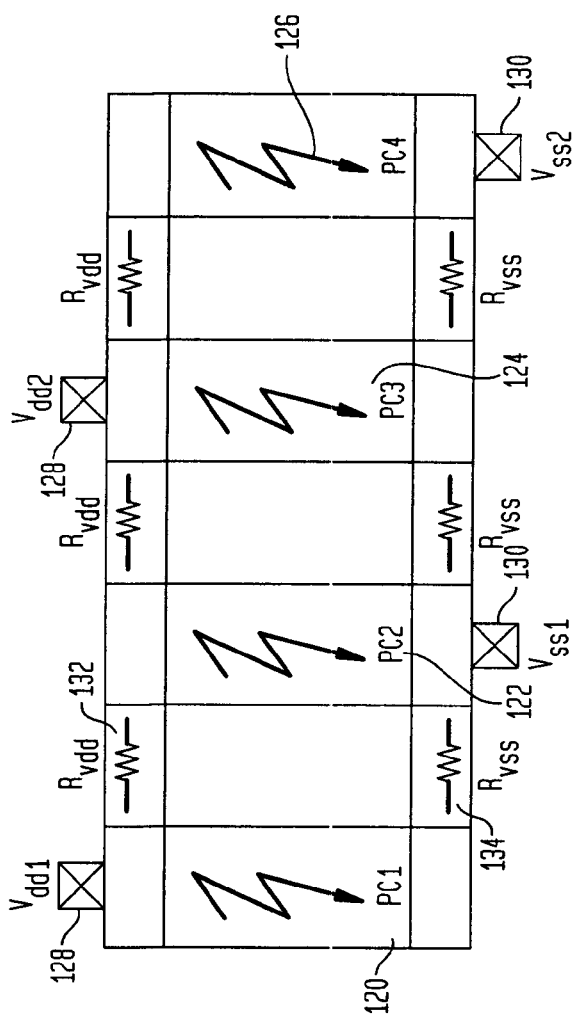
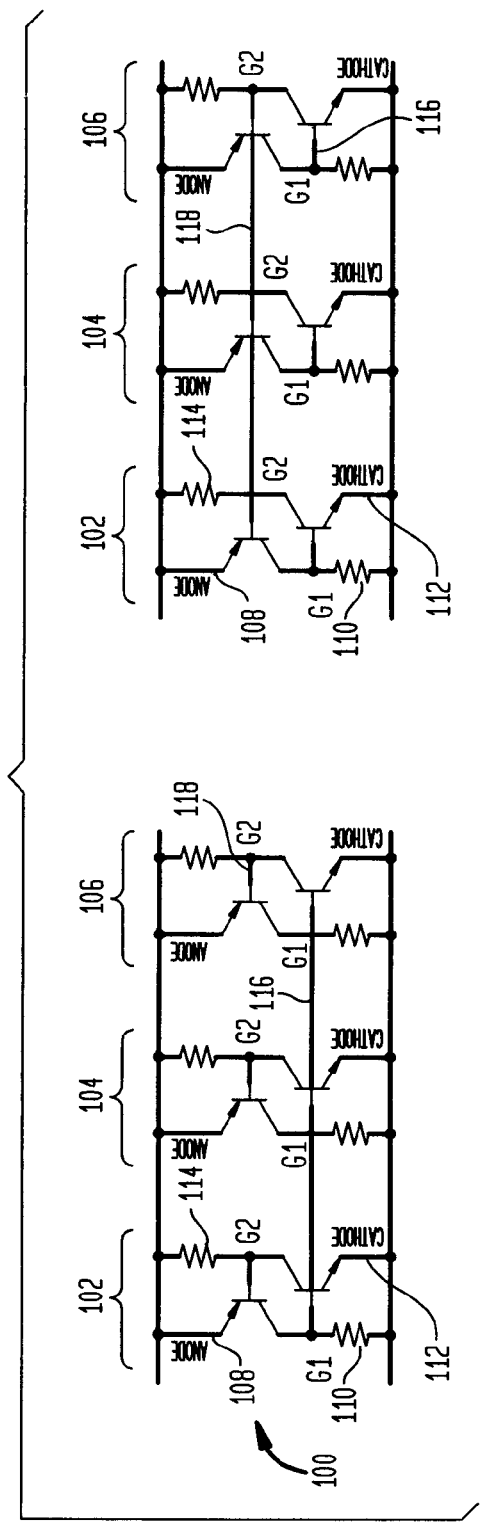
FIG. 1A
FIG. 1B

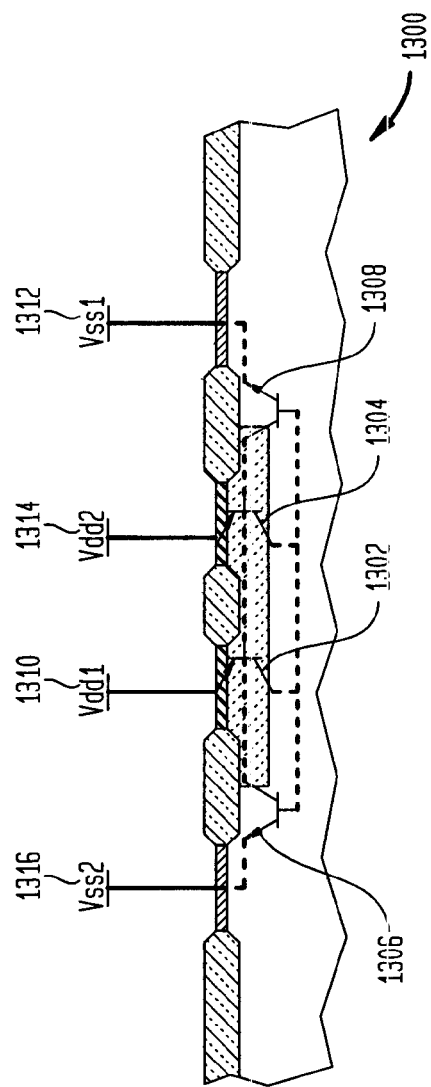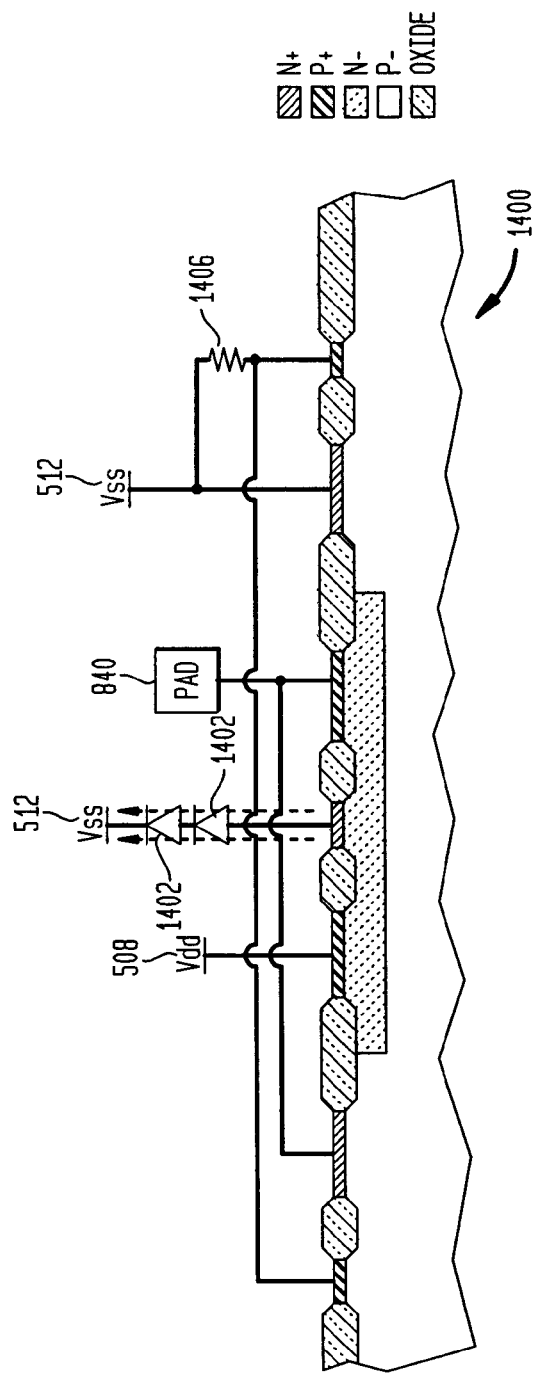

ELECTROSTATIC DISCHARGE PROTECTION CIRCUIT

CROSS REFERENCES

This application is a divisional of U.S. patent application Ser. No. 11/395,954 filed Mar. 30, 2006, which claims priority of U.S. Provisional Application Ser. No. 60/666,445 filed Mar. 30, 2005, entitled, "Electrostatic Discharge Protection Circuit". The entire disclosure of both these applications is incorporated herein by reference.

FIELD OF THE INVENTION

This invention generally relates to the field of electrostatic discharge (ESD) protection circuitry, and more specifically, improvements for silicon controlled rectifier (SCR) structures in the protection circuitry of an integrated circuit (IC).

BACKGROUND OF THE INVENTION

Integrated circuits (IC's) and other semiconductor devices are extremely sensitive to the high voltages that may be generated by contact with an ESD event. As such, electrostatic discharge (ESD) protection circuitry is essential for integrated circuits. An ESD event commonly results from the discharge of a high voltage potential (typically, several kilovolts) and leads to pulses of high current (several amperes) of a short duration (typically, 100 nanoseconds). An ESD event is generated within an IC, illustratively, by human contact with the leads of the IC or by electrically charged machinery being discharged in other leads of an IC. During installation of integrated circuits into products, these electrostatic discharges may destroy the IC's and thus require expensive repairs on the products, which could have been avoided by providing a mechanism for dissipation of the electrostatic discharge to which the IC may have been subjected.

In order to protect against these over-voltage conditions, protection devices such as silicon controlled rectifiers (SCR) or Metal Oxide Semiconductor (MOS) devices have been incorporated within the circuitry to provide a discharge path for the high current produced by the discharge of the high electrostatic potential. Prior to an ESD event, the protection device is in a non-conductive state. Once the ESD event is detected, the protection device then changes to a conductive state to shunt the current to ground. The protection device maintains this conductive state until the voltage is discharged to a safe level.

When protecting an IC (Integrated Circuit) against ESD (Electro Static Discharge) stress, the classic approach is to use a number of independently triggered placed power clamps (PC1 to PCn). FIG. 1A shows an illustration of the classical approach in which four independently triggered power clamps PC1 120, PC2 122, PC3 124, and PC4 126 are used. PC1 120 and PC3 124 are placed in a Vdd 128 power pad cell, and PC2 122 and PC4 126 are placed in a Vss 130 ground pad cell. In between the power and ground pad cells the power and ground busses have a certain amount of bus resistance RVdd 132 and RVss 134. When using this approach, the voltage over an I/O or core element is not only dependent on the characteristics of the clamps itself but also on the bus resistance between this element and the clamp. Usually the ESD designer assumes a worst case scenario in which only one clamp triggers, and in which this clamps will take all the current. Because one cannot be sure which and how many clamps will trigger, this is a necessary approach. However, this approach leads to less area efficient, and sometimes over dimensioned or unrealistically big ESD protection device sizes. Especially in technologies which have a decreased ESD design windows, increased dynamic on resistance of protection devices and decreased heat dissipation characteristics of the active silicon film, the need to ensure more clamps to trigger is high.

When using the classical approach of uncoupled clamps, triggering of multiple clamps highly depends on the Vt2/Vt1 relationship, with Vt2 the failure voltage and Vt1 the trigger voltage of the clamp, and the resistance of the busses in between the individual clamps. Imagine e.g. in FIG. 1A that we stress the Vdd1 128 pin positively to Vss2 130. In such a case all four clamps have theoretically the same chance of triggering.

Let's assume that PC1 120 triggers first. Then the voltages over the other clamps are given by:

$$V_{PC2} = V_{PC1} + R_{Vss} * I$$

$$V_{PC3} = V_{PC1} + 2 * R_{Vss} * I$$

$$V_{PC4} = V_{PC1} + 3 * R_{Vss} * I$$

Note that I is the current and V is the voltage with * being a multiplication sign. Also, $V_{PC1}, V_{PC2}, V_{PC3}$ AND $V_{PC4}$ are voltages at clamps 1, 2, 3 and 4 respectively. Clamps PC2 122 PC3 124 and PC4 126 will also trigger when the following voltage relationship becomes true:

$$V_{PC2} > V_{t1}$$

$$V_{PC3} > V_{t1}$$

$$V_{PC1} > V_{t1}$$

The clamp, PC4 126 which is closest to the ground pad has the biggest chance to trigger next. However, whether PC4 126 and other clamps will trigger depends greatly on two factors. First, Vt2 being greater than Vt1 or not, and the second on the amount of bus resistance between the different clamps.

Now let's assume another case (again positive stress from $V_{dd1}$ to $V_{ss2}$) in which power clamp PC2 122 first triggers. Then the voltages over the other claims are given by:

$$V_{PC1} = V_{PC2} + R_{Vdd} * I$$

$$V_{PC3} = V_{PC2} + R_{Vss} * I$$

$$V_{PC4} = V_{PC2} + 2 * R_{Vss} * I$$

Clamps PC1 120, PC3 124 and PC4 126 will also trigger when the following voltage relationship becomes true:

$$V_{PC1} > V_{t1}$$

$$V_{PC3} > V_{t1}$$

$$V_{PC4} > V_{t1}$$

The clamp PC4 128, which is closest to the ground pad has the biggest chance to trigger next. However, whether PC4 126 and other clamps will trigger depends greatly on two factors. First, Vt2 being great than Vt1 or not, and second on the size of the bus resistance between the different clamps.

Especially when Vt2>Vt1, we can more safely assume that more than one clamp will take the current and in such a case the individual clamps can be downsized. However, many technologies produce ESD protection devices which have a deep snapback, and which have Vt2<Vt1. In such cases, we cannot assume that multiple clamps will take the ESD discharge current. Moreover, in technologies which are characterized by a low heat dissipating efficiency (low It2), high Ron, and decreased ESD design windows (decreased Gate Oxide (GOX) breakdown voltages), the demand to couple the ESD is high. In such a case one needs to ensure or initiate the simultaneous triggering of multiple clamps to ensure multi-clamp triggering.

This problem isn't limited to different clamps but it's also possible in one clamp that consists of many separate fingers. FIG. 1B depicts a schematic diagram of a prior art multi-fingered SCR ESD protection circuit 100, which serves as protection circuitry for an integrated circuit (not shown). The circuit 100 having multiple SCR fingers, and is illustratively depicted in FIG. 1B having three SCR "fingers" 102, 104 and 106. Each finger works as a separate clamp, but is layouted as one whole clamp. The SCR protection circuit 100 comprises a first trigger device 108, a first SCR 102 (i.e. "first finger"), a second SCR 104 (i.e. "second finger") and a third SCR 106 (i.e. "third finger"). The first SCR 102 further comprises PNP transistor and an NPN transistor. In particular, the first SCR 102 includes an anode 108, which is connected to a pad (not shown) and to one side of a resistor 114. The resistor 114 represents the resistance of the N–well (or an external resistor), which is seen at the base of the PNP transistor of the SCR 102. Also, included is a cathode 112 which is connected to a ground (not shown) and to one side of a resistor 110. The resistor 110 represents the resistance of the P–well (or an external resistor) which is seen at the base of NPN transistor. The second and third SCRs 104 and 106 are formed exactly in the same manner as described with regard to the first SCR 102. When SCRs 102, 104, 106 are placed in parallel as shown in FIG. 1B multifinger triggering is a potential issue. The typical solution is to connect a first triggering device G1 116 and/or a second triggering device G2 118, as shown in FIG. 1B such that the voltage drop seen by all anode/G2 respectively G1/Cathode diodes is the same. However, when the SCR goes into high injection mode, the structure acts like a PIN diode, such that the G1 and G2 taps do not control the voltage at the Nwell/Pwell junction anymore. This renders the multifinger triggering solution of connection the gates of the different SCRs ineffective. Therefore, there is a need in the art for a multi-fingered SCR protection device having an enhanced and reliable triggering mechanism.

A SCR in its basic form is depicted as a prior art in FIG. 1C with an anode 136 and cathode 138. It is regarded as a PNPN structure, formed by P+, N– well, P–substrate and N+. When using SCR's to protect a chip against ESD, one SCR is needed for each possible current path. As seen in FIG. 1C, each SCR takes some area to implement. The large number of clamps (each current path needs its own clamp) increases the needed area for the ESD protection. So, there is a need in the art to incorporate different clamps into one clamp and also to couple these clamps to overcome the disadvantages of the prior art.

SUMMARY OF THE INVENTION

The disadvantages heretofore associated with the prior art are overcome by one embodiment of the present invention of an electrostatic discharge (ESD) protection circuit comprising at least a clamp having at least one first anode coupled to a first voltage potential and at least one first cathode coupled to a second voltage potential. Also included is at least a second clamp having at least one second anode coupled to a third voltage potential and at least one second cathode coupled to the fourth voltage potential. In the preferred embodiment the clamps are scr's. In this case the first and second cathodes have at least one first high-doped region and the first and second anodes have at least one second high-doped region. The circuit further includes at least one first trigger tap disposed proximate to the first high-doped region of the first cathode and at least one second trigger-tap disposed proximate to the first high-doped region of the second cathode. Additionally, at least one first low ohmic connection is coupled between the first and second trigger-tap to connect the first and second silicon controlled rectifiers.

In another embodiment of the present invention, an electrostatic discharge (ESD) protection circuit is provided comprising a silicon controlled rectifier (SCR) having a plurality of SCR fingers. Each SCR finger includes an anode and cathode. A boost circuit is connected to the anode or cathode. The scr comprises at least one first trigger-tap. Additionally, at least one first low-ohmic connection is respectively coupled between the at least one trigger tap of each SCR finger.

In even further embodiment of the present invention, an electrostatic discharge (ESD) protection circuit is provided in a semiconductor integrated circuit comprising at least a first silicon controlled rectifier including at least one first region having a first conductive type formed in a second region having a second conductive type opposite to the first conductive type and at least one third region having a second conductive type formed in a fourth region having a first conductive type, said first region type coupled to a first voltage potential and said third conductive element coupled to a second voltage potential The circuit further comprises at least a second silicon controlled rectifier including at least one fifth region having a first conductive element formed in a sixth region having a second conductive type and at least one seventh region having a second conductive element formed in a eighth region having a first conductive type, said fifth conductive element coupled to a third voltage potential and said seventh conductive element coupled to a fourth voltage potential;

BRIEF DESCRIPTION OF THE DRAWINGS

FIG. 1A depicts an illustration of a prior art classical approach of uncoupled ESD protection clamps.

FIG. 1B depicts a schematic diagram of a prior art multi-fingered SCR ESD protection circuit.

FIG. 13 depicts an illustrative cross-section diagram of an SCR for ESD protection according to an another embodiment of the present invention.

FIG. 14 depicts an illustrative cross-section diagram of an SCR for ESD protection according to an another embodiment of the present invention.

DETAILED DESCRIPTION OF THE INVENTION

In one embodiment of the present invention, a novel coupled clamping technique is shown which ensures multi-clamp triggering. The novelty of this embodiment is the coupling of the trigger gates of the separate clamps through low-ohmic connections, such as metal lines, or preferably feeding the triggering signal simultaneously to the trigger gates of the different clamps, or preferably making the anode and/or cathode of the clamps in the same active well, so as to ease the triggering of a network of clamps. The invention relates to the principle in which, when one certain ESD clamp triggers, it enables or triggers another ESD clamp or a group of other ESD clamps. When applying this technique to a number of ESD clamps in a certain IC protection scheme, all those clamps will trigger nearly simultaneously, therefore limiting the potential differences on the whole IC. This is very advantageous for an ESD protection strategy, especially against charged device model (CDM) stress, where it is critical to limit voltage drops anywhere on the IC as fast and efficient as possible. This is critical because for instance the capacitance related to two different power domains can be quite different so that large voltage differences can be built up during the discharge of a CDM event. If the power clamps related to these different power domains trigger together, this problem is less severe.

Figure 2:
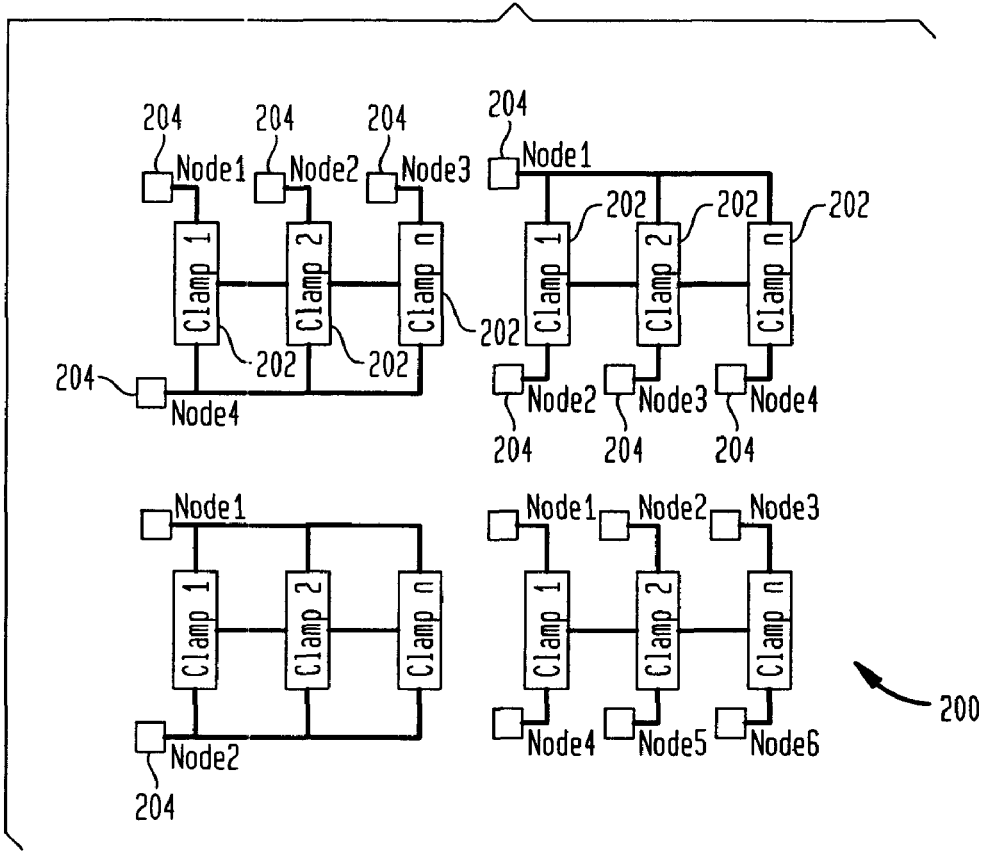
FIG. 2 depicts an illustrative schematic diagram of different possible schematics for interconnecting ESD clamps in another embodiment of the present invention.
Figure 3:
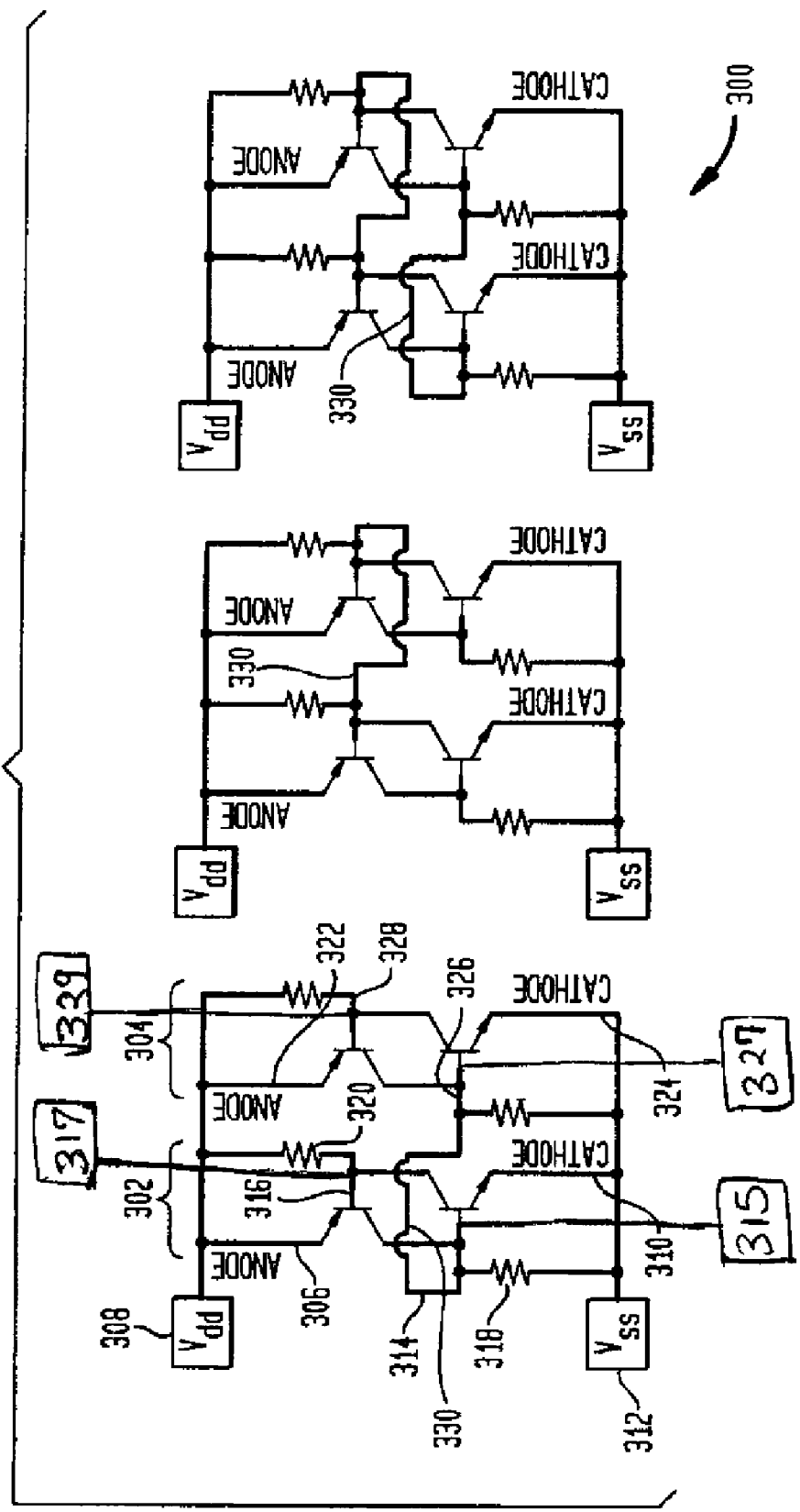
FIG. 3 depicts an illustrative schematic diagram of different possible schematics for connecting SCR clamps with enhanced coupling technique in another embodiment of the present invention.

Referring to FIG. 2 a generic representation of the invention is shown illustrating different possible schematics 200 for interconnecting ESD clamps to provide simultaneous triggering. There are a number of clamps (n) 202 which are interconnected in order to trigger each other. The anodes and cathodes (not shown) are connected to nodes (n) 204 such as node1, node2, node3 and node4. They are connected preferably to different protected nodes (n) 204, as well as the same nodes (n) 204 as illustrated in FIG. 4A and FIG. 4B respectively. So, the clamps 202 can be preferably be connected between any possible nodes 204. They can have separate nodes 204 or common nodes 204, or a combination of both. Whenever one clamp 202 triggers, it provides a voltage or current to the other clamps 202 it is connected with to trigger those other clamps 202. Principally when a first clamp triggers, a part of the current will be tapped and used as a (current) signal or converted to a (voltage) signal which enables a second clamp to trigger, as well as any number of other clamps. In one example, the clamps are the power clamps of different power domains. There are several implementations possible. In the case of ground gate negative-channel metal oxide semiconductor (GGNMOS) based clamps, they can be connected in a fashion as used with enhanced multi-finger triggering techniques as like domino-triggering. In the case of SCR clamps, their triggering gates G1 or G2 can be connected together. This can by done by hard wiring them with metal liners, or by placing the anodes of the SCR clamps in the same well, or by placing the cathodes of the SCR clamps in the same well. This is shown in FIG. 3 as described in detail below. This invention is not limited to these two cases, which are only meant to illustrate the concept.

FIG. 3 depicts an illustrative schematic diagram of different possible schematics for connecting SCR clamps with enhanced coupling technique in another embodiment of the present invention. Referring to FIG. 3 an ESD protection circuit 300 is shown, having a first SCR clamp 302 and a second SCR clamp 304. SCR clamp 302 includes a first anode 306 coupled to a first voltage potential Vdd 308 connected to a pad of the circuitry (not shown) and a first cathode 310 coupled to a second voltage potential Vss 312 preferably connected to ground (not shown). Also, a first trigger tap G1$a$ 314 connected to a triggering device/element (not shown) is disposed proximate to the first cathode 310 and a third trigger tap G2$a$ 316 is disposed proximate to the first anode 306 as shown in FIG. 3. Additionally, a first resistor Rg1$a$ 318 is connected parallel to the first cathode 310 and a second resistor Rg2$a$ 320 is connected parallel to the first anode 306. Similarly, SCR clamp 304 includes a second anode 322 coupled to the Vdd 308 and a second cathode 324 coupled to the Vss 312. Also, a second trigger tap G1$b$ 326 connected to a triggering device/element (not shown) is disposed proximate to the second cathode 324 and a fourth trigger tap G2$b$ 328 is disposed proximate to the second anode 322 as shown in FIG. 5B. FIG. 5C illustrates connecting the first trigger tap G1$a$ 314 to third trigger tap G2$a$ 316 and connecting second trigger tap G1$b$ 326 to fourth trigger tap G2$b$ 328.

Note that this circuit shown in FIG. 3 is not limited to two clamps, but can be applied to any number of clamps. Although, the first trigger tap G1$a$ 314 and second trigger tap G1$b$ 326 are shown as two separate trigger taps, however, they are essentially one trigger tap G1. Similarly, the third trigger tap G2$a$ 316 and fourth trigger tap G2$b$ 328 are shown as two separate trigger taps, but the are considered essentially one trigger tap G2. Moreover, the SCR's can have a trigger element apart from the shared trigger line, i.e. an external on-chip triggering devices 315, 317, 327 and 329 coupled to the trigger taps 314, 316, 326 and 328 respectively as shown in FIG. 3. An example of this could be a number of GGNMOS triggered SCR clamps (GGSCR's) where the GGNMOS is connected between G2 tap and ground of any or some SCR's and where the G1 tap of any SCR is connected to G1 of any other SCR. Or, a number of GGSCR clamps where the GGNMOS is connected between G2 and ground of any or some SCR's, and where the G2 tap of any SCR is connected to G2 of any other SCR.

Referring to FIG. 3 ($a$), for example, let's consider the two SCR devices 302 and 304. The trigger taps/gates G1$a$ 314 and G1$b$ 326 of both SCR's 302 and 304 respectively, are connected together. When the first SCR 302 now triggers due to an ESD event, a certain voltage will occur at the G1$a$ 314 node. Due to this voltage drop, some current will be able to flow to the G1$b$ 326 node of the second SCR 304. This current will forward bias the G1$b$ 326-cathode 324 diode of this SCR 304, thus triggering it. If the G1a 314-G1b 326 connection 330 is fabricated from low ohmic connection, preferably metal lines, the current will flow through the metal lines. If the SCR's have a shared Pwell, carriers generated from the first SCR 302 in the Pwell will also trigger the other SCR 304. Note that all of this can also be done by alternatively by connecting the G2 gates of SCR's together with a low ohmic connection 330 in the same fashion as shown in FIG. 3b. Furthermore, in another alternative embodiment, both G1 nodes of SCR 302 and G2 nodes of SCR 304 can be connected with low ohmic connection 330 as shown in FIG. 3c in order to stimulate triggering of the clamps. This technique can be applied to any number of SCR's.

A possible problem that could occur with this technique is that the voltage which is built up by the triggered element is not high enough to trigger a neighboring device. In this case, some boost circuitry can be inserted into the schematic. This boost circuit causes the trigger voltage to increase, thus triggering other SCR's more easily. Depicted in FIG. 4 are some possible implementations of this boost circuit as described in detail below.

Figure 4:
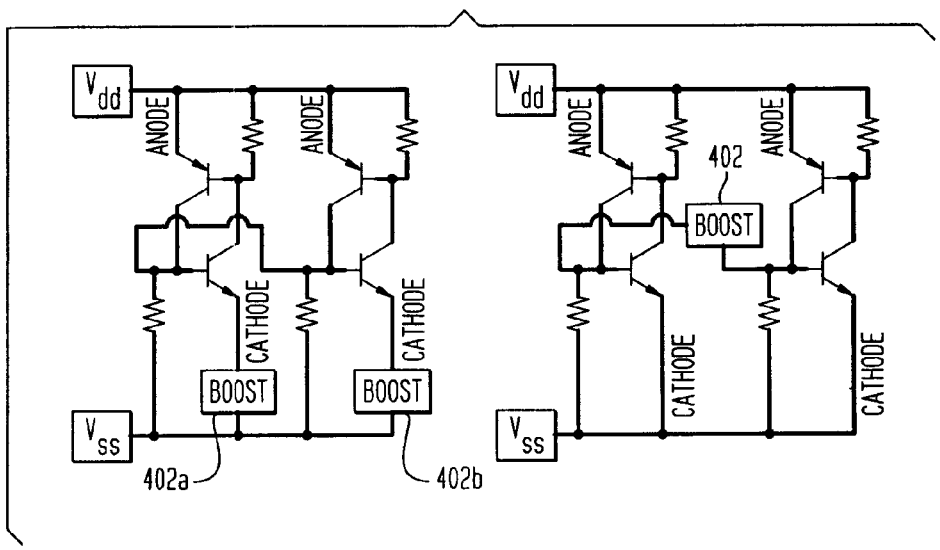
FIG. 4 depicts an illustrative schematic diagram of different possible schematics for connecting SCR clamps with an enhanced coupling technique with reference to FIG. 3 in an alternate embodiment of the present invention.

Referring to FIG. 4, there is illustrated a schematic diagram of different possible schematics for connecting SCR clamps of FIG. 3 with an enhanced multi-fingering technique in an alternate embodiment of the present invention. In FIG. 4(a), a first boost circuit 402a connected in series with the first cathode 310 of the first SCR 302 and a second boost circuit 402b connected in series to the second cathode 324 of the second SCR 304. When the first SCR 302 triggers, the boost circuit 402a will have a certain voltage drop over it, thus effectively increasing the voltage on node G1a 314. This increased voltage will ease triggering of the other SCR 304. Alternatively, as shown in FIG. 6(b), only one boost circuit 402 is connected in series with the G1a 314-G1b 326. This circuit amplifies the signal coming from one SCR 302 or 304, boosting the other SCR 304 or 302 respectively. The amplifier can be constructed to operate in a single direction as well as to operate in both directions. Note that although, not shown more implementations are possible, for example where a boost circuit 402 would be connected in series with the Vdd line and the anode of each SCR 302 and 304.

Figure 5:
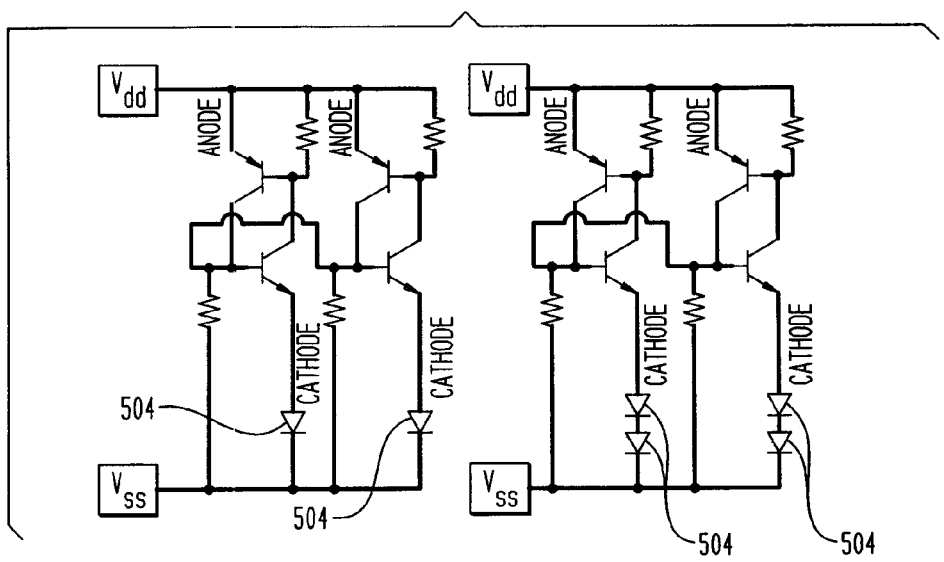
FIG. 5 depicts an illustrative schematic diagram of an alternate embodiment with reference to FIG. 4 of the present invention.

A possible practical implementation of FIG. 4(a) can be found as an alternative embodiment in FIG. 5 of the present invention. The boost circuit 402 is here a diode 404 as shown in FIG. 6A or a string of diodes 404 as shown in FIG. 6B. When an SCR 302 or 304 is inactive (high resistive state), no current will flow through its series diode(s) 404, thus no voltage drop will exist over the diode(s) 404. When an SCR 302 or 304 is active (low resistive state), high ESD current will flow through the SCR and it's series diodes 404. In this case, every diode 404 will build up by approximately 1V. The voltage on the G1 connection line will be boosted by 1V*number of series diodes. (i.e. 1V multiplied by number of series diodes). This condition will facilitate the triggering of other SCR's. In order to tune the performance of the whole circuit, the number of diodes can be altered.

One skilled in the art will also understand that this boost circuit 402 could also comprise one of the devices such as a MOS, resistor, capacitor, inductor or any other device that has a resistance Also, each of the boost circuit 402 may preferably be included in only one of the SCR fingers or in any possible combination of two or more SCR fingers.

It is to be noted that coupling multiple clamps (as described above) can preferably be used, for example, in multiple SCR fingers to simulate synchronous triggering of the clamps. In another embodiment of the present invention, there is shown that the problem of triggering is not only with different clamps but also in one clamp, provided by a multi-fingered SCR ESD protection circuit as described herein below.

Figure 1C:
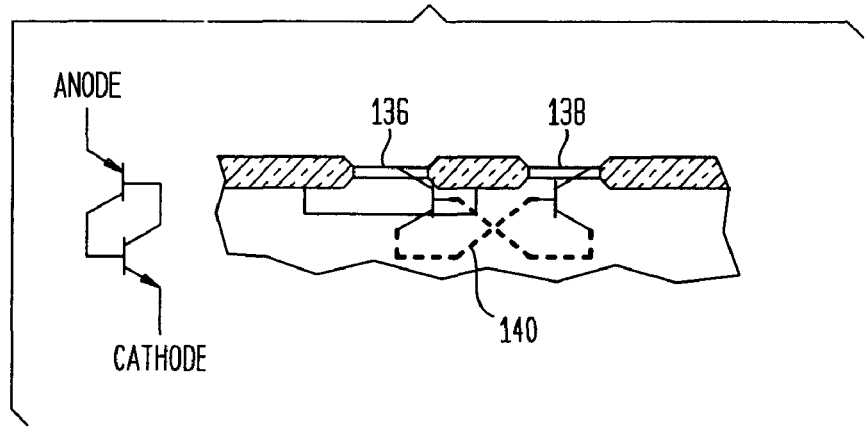
FIG. 1C depicts a layout of a cross-section diagram of a prior art SCR
Figures 6, 7:
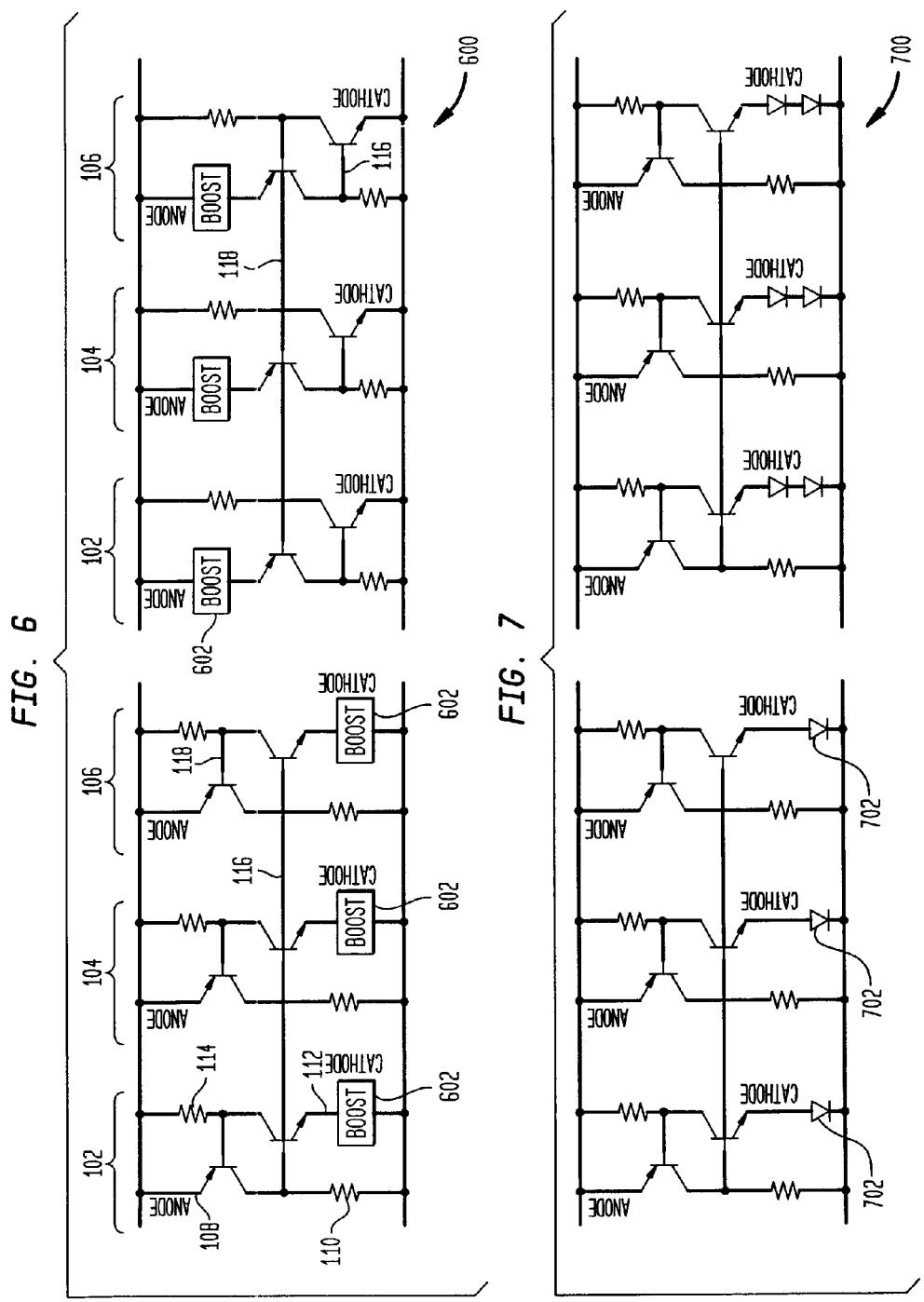
FIG. 6 depicts an illustrative schematic diagram of one embodiment of a multi-fingered SCR ESD protection circuit of the present invention.
FIG. 7 depicts an illustrative schematic diagram of an alternate embodiment with reference to FIG. 6 of the present invention.

FIG. 6 depicts an illustrative schematic diagram embodiment of a multi-fingered SCR ESD protection circuit 600 of the present invention which serves as protection circuitry for an integrated circuit (not shown). Similar to FIG. 1B, the SCR circuit 600 comprises multiple SCR fingers, and is illustratively depicted in FIG. 6 having three SCR "fingers" 102, 104 and 106. The SCR protection circuit 600 comprises first SCR 102 (i.e. "first finger"), a second SCR 104 (i.e. "second finger") and a third SCR 106 (i.e. "third finger"). The first SCR 102 further comprises PNP transistor and an NPN transistor. In particular, the first SCR 102 includes at least one anode 108, as known in the art, is one interspersed high-doped first region formed within a first lightly doped region. The anode 108 is connected to a first voltage potential, preferably a pad (not shown) and to one side of a resistor R1 114. The resistor R1 114 represents the resistance of the N-well (or an external resistor), which is seen at the base of the PNP transistor of the SCR 102. Also, included is a at least one cathode 112, as known in the art, is a interspersed high-doped second region formed within a second lightly doped region. The cathode 112 is connected to a second voltage potential, preferably ground (not shown) and to one side of a resistor R2 110. The resistor R2 110 represents the resistance of the P-well (or an external resistor) which is seen at the base of NPN transistor 106. Furthermore, the circuit 600 comprises a boost circuit 602 connected to the cathode 112 or alternatively to the anode 108 as shown in FIG. 6. The boost circuit provides an additional voltage drop at a trigger tap (116 or 118 in FIG. 6) as the trigger current runs through the boost circuit. The boost circuit 602 of FIG. 6 may preferably be one or more diodes 702 as shown in an alternate embodiment of a multi-fingered SCR ESD protection circuit 700 in FIG. 7. One skilled in the art will also understand that this boost circuit 602 could also comprise one of the devices such as a MOS, resistor, capacitor, inductor or any other device that has a resistance The second and third SCRs 104 and 106 are formed exactly in the same manner as described with regard to the first SCR 102.

As shown in FIG. 6, a first triggering device (not shown in the figure) represented by a node G1 116 is connected to the cathode 112 for supplying current to each of the SCR fingers 102, 104, 106. Alternatively, there may be included a second triggering device represented by a node G2 118 connected to the anode 108. such that the voltage drop seen by all anode/G2 respectively G1/Cathode diodes is the same. Referring to FIG. 6 where the boost circuit 602 is connected to the cathode 112, In this case scenario, the G1 node 116 will be pushed higher with respect to ground. Therefore, fluctuations in G1-Cathode voltage will be relatively smaller. Since the G1 node 116 will be pushed higher, the current will be uniformly distributed over all the cathodes. In other words, the current flowing through the boost circuit 602 at the cathode 112 of the SCR finger 102 will build up enough voltage to be more uniformly distributed over all the other SCR fingers 104 and 106 to trigger. Also, as G1 node 116 has a higher potential, more current will flow through the R1 110 resistor. Since more current will flow through the R1 110 resistor, less current will initially flow through the cathode of the SCR. This gives the other fingers more time to trigger, relaxing the multifinger triggering issue. Note that although not shown here, G2 connections 118 can be also made. Anyone skilled in the art will understand that pushing G2 118 lower by adding a boost-like circuit 602 between the first voltage potential (not shown) and anode 108 will create a similar effect.

It is important to note that each boost circuit 602 may preferably be included in only one of the SCR fingers or in any possible combination of two or more SCR finger.

Figure 8A:
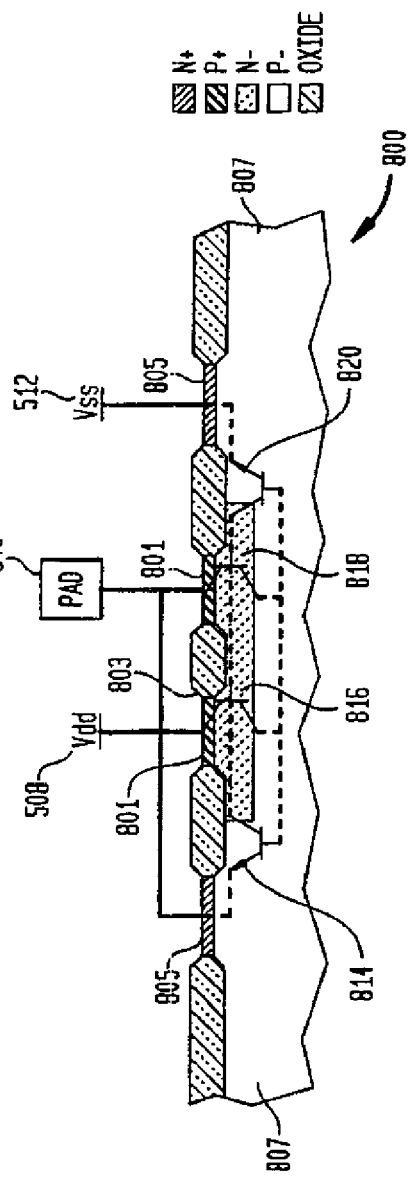
FIG. 8A depicts an illustrative cross-section diagram of a structure for ESD protection according to one embodiment of the present invention.

In a further embodiment of the present invention, there is proposed a structure 800 illustrated as a cross-section diagram in FIG. 8A for ESD protection, based on SCR operation. It can be placed at any pin of a chip (not shown). The structure 800 is basically an SCR with preferably at least two anodes 802 and 804 or at least two cathodes 806 and 808. The purpose is if one of the inherent SCR's get triggered, the other SCR's in the structures will tend to trigger as well because all SCR parasitics share the same well (the base of all parasitic bipolars are connected by the well resistance). This behavior is especially wanted for CDM stress. Beside this advantage, the protection structure is also an element that can protect the chip against ESD stress along several current paths at the same time. For example, to protect an input pin (not shown), placing such a structure could not only protect the chip for stress from input to the first voltage potential Vdd 508, but also for stress from input to the second voltage potential Vss 512. With conventional solutions, two elements were needed to achieve this protection, one element for each current path.

Figure 8B:
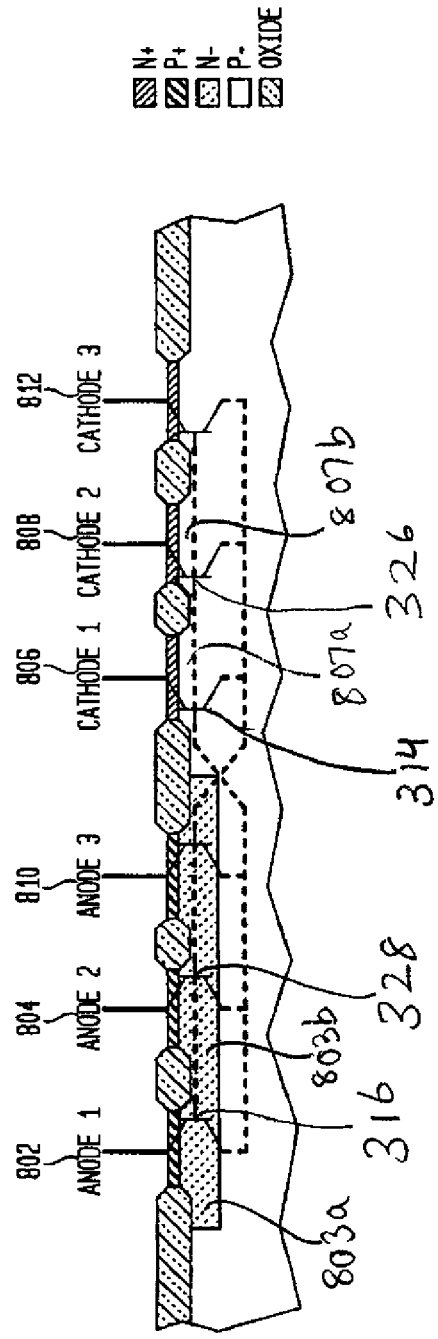
FIG. 8B depicts an illustrative cross-section diagram of a structure for ESD protection according to an alternate embodiment of the present invention.

Alternatively, a generic cross section of the SCR structure 800 is shown in FIG. 8B with three anodes 802, 804 and 810 and three cathodes 806, 808 and 812. An inherent or parasitic SCR is shown in dashed line as will be described in greater detail below with reference to FIG. 8A. Note that the number of anodes and cathodes doesn't need to be three. Neither does the number of anodes and cathodes need to be equal. There can for example be two anodes and one cathode, or one anode and four cathodes or any number of combinations can be possible.

In order to ensure the desired operation of the invention, additional elements may be added as well. This includes, but is not limited to trigger elements or structures that alter the holding voltage such as diodes in series with the invention.

Referring back to FIG. 8A, there is shown another embodiment of the present invention. The structure 800 consists of two P+ regions 801 in the same N− well 803, located next to two N+ regions 805 in the P− substrate 807. This structure comprises 4 parasitic bipolars, bipoloar1 814, bipolar2 816, bipolar3 818 and bipolar4 820, creating 3 inherent SCR's. The first SCR is created by parasitic bipolar2 816 & parasitic bipolar4 820 and exists between Vdd 508 and Vss 512. The second one is an SCR created by parasitic bipolar2 816 and parasitic bipolar1 814 between Vdd 508 and a PAD 840. PAD 840 represents the bonding pad of an IO pin (not shown). The third one is an SCR created by parasitic bipolar3 818 & parasitic bipolar4 820 between the PAD 840 and Vss 512. Both the second SCR and the third SCR act as a local clamp here. As shown in FIG. 8B, Anode1, 802 is formed in a first N-type region 803 of the N-well 803 and Anode2, 804 is formed in a second N-type region 803b of the N-well 803. Similarly, in FIG. 8b, Cathode1, 806 is formed in a first P-substrate region 807a of the P-substrate 807 and Cathode2, 808 is formed in the second P-substrate region 807b of the P-substrate 807.

The advantage of this structure is that when one of the three SCRs gets triggered, the other ones can trigger as well, if current is supplied to the anodes. For the trigger speed of the different SCR's, the placement of the N+ 805 and P+ 801 regions is of big importance. One can place both N+ 805 regions on one side of the N− well 803, or one N+ region 805 on each side of the well as is shown in FIG. 8A. Both solutions will differ on trigger speed, resistance during conducting state and other factors such as trigger voltage. Those who are skilled in the art will know how to design the structure in such a way to get optimal ESD performance from it.

Figure 9A:
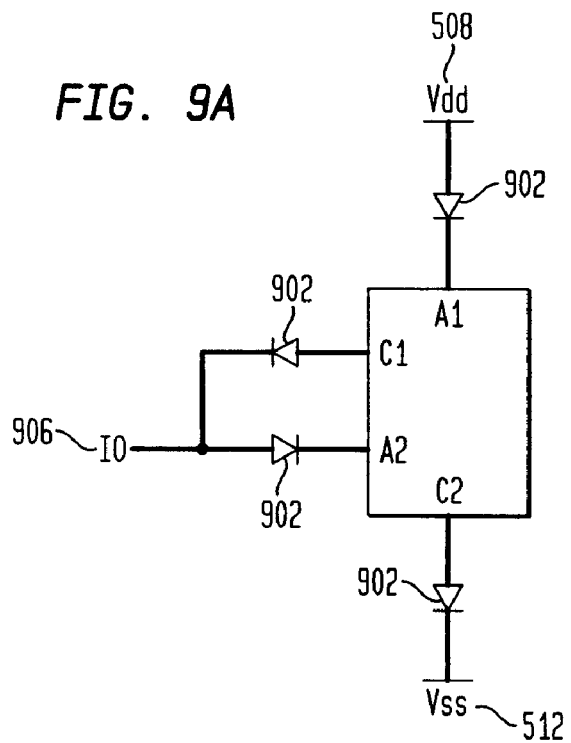
FIG. 9A and FIG. 9B depicts an illustrative schematic diagram of an alternate embodiment with reference to FIG. 8A of the present invention.
Figure 9B:
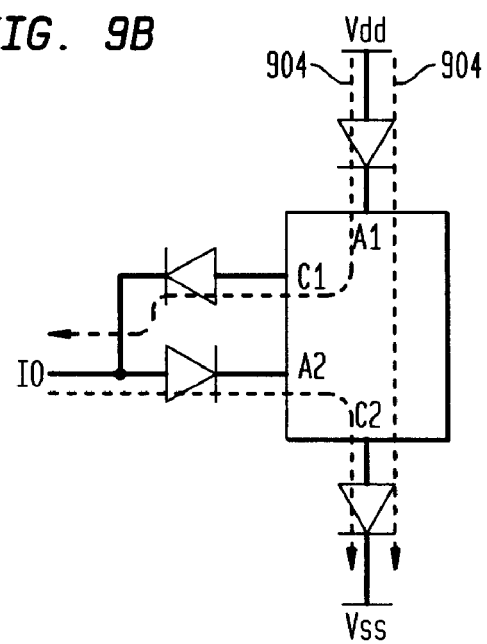

When one wants to add holding diodes to the structure in order to make the holding voltage higher, this is possible in many different ways. FIG. 9 illustrates a schematic representation 900 of the structure from FIG. 8A with addition of holding diodes 902. Depicted in FIG. 9A are the addition of holding diodes 902. Depicted in FIG. 9B is a possible example where each of the three possible ESD paths 904 has two holding diodes 902 in series. The three paths 904 are shown in dashed lines in FIG. 9B. The protection structure of FIG. 9 represents the one from FIG. 8A and consists of an SCR with 2 anodes 802 and 804, and two cathodes 806 and 808. FIG. 9 shows one configuration, but many different configurations are possible. For example the path from Vdd 508 to Vss 512 can have 2 holding diodes 902, while the paths from Vdd 508 to IO 906 and from IO 906 to Vss 512 may preferably have no diodes. In this case, the anti-parallel diodes at the IO 906 line can be left out.

Figure 10:
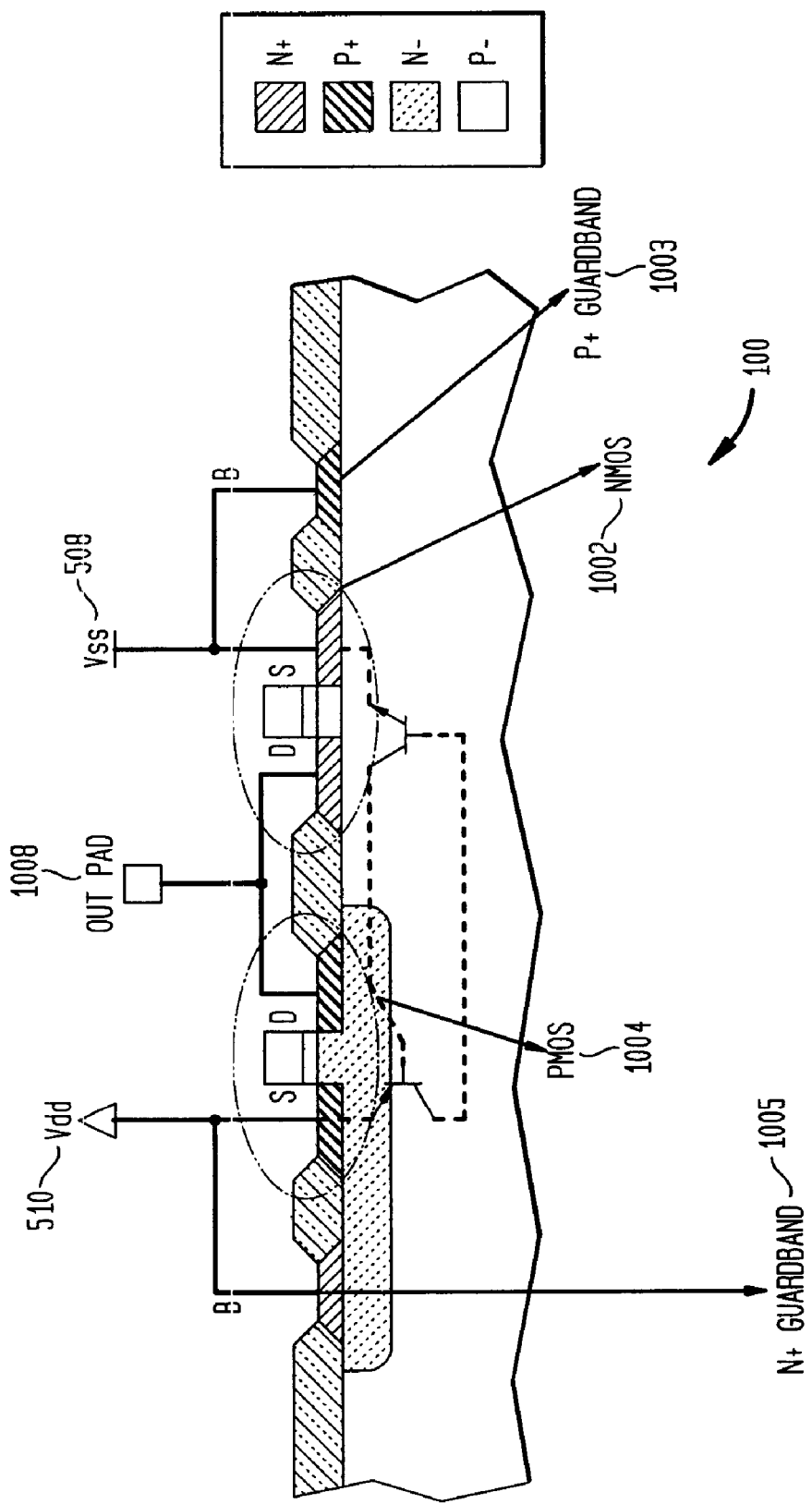
FIG. 10 depicts an illustrative cross-section diagram of an SCR for ESD protection according to another embodiment of the present invention.

In an even further embodiment of the invention, there is shown a cross-section diagram of the SCR structure 1000 in FIG. 10. It is made by having the invention inherent in an output driver due to parasitic elements. The SCR structure 1000 with two anodes and two cathodes is created in an output driver. The structure 1000 is totally inherent to the driver. The layout of this driver can be altered for an optimal working of the structure. Both the NMOS 1002 and PMOS 1004 from the driver stage create the SCR's. By removing the sides of each of P+ guardband 1003 and N+ guardband 1005 band in between the two MOS transistors 1002 and 1004, a structure that can easily latch is created. The structure has two anodes, formed by the drain and source of the PMOS 1004, as well as two cathodes formed by the drain and source of the NMOS 1002. An SCR between Out PAD 1008 and Vss 512 is created and uses the Drain of the PMOS as anode. Another SCR between Vdd 508 and Out PAD 1008 uses the drain of the NMOS cathode. This embodiment thus shows the intended creation of an SCR with multiple anodes and cathodes in an output buffer to create an ESD protection structure, which simultaneously works as a power clamp between Vdd 508 and Vss 512 and as a local ESD protection for the output pad.

In prior arts, all these parasitic SCR's were seen as a problem for LU (latchup) issues. In the present invention, it is a way to create ESD protection. To avoid any LU issues using this SCR during normal operation of the chip, two approaches can be used. First, the holding voltage of the parasitic SCR between Vdd and Vss can be above the normal Vdd voltage. For LV technologies, such as 1V 65 nm CMOS, this is easily achieved since second, the trigger current can be increased above the latch up current ($I_{latch}$). This can be done by making the G2 (N+ in N− well) to Vdd connection and the G1 (P+ in P− well) to VSS connection low ohmic. In other words, the bulk ties in N− well and/or P− well need to be well placed in order to lower the well resistances.

In order to improve the ESD capabilities of the inherent SCR from Vdd to Vss, the drain/source regions can be swapped, both for the NMOS as for the PMOS driver. This would reduce the length Anode/Cathode (LAC) spacing of the inherent SCR and thus improve its speed LAC is the distance between the anode and the cathode. Note that this will also affect the performance of the SCR's between Vdd and PAD, and PAD and Vss.

Figure 11A:
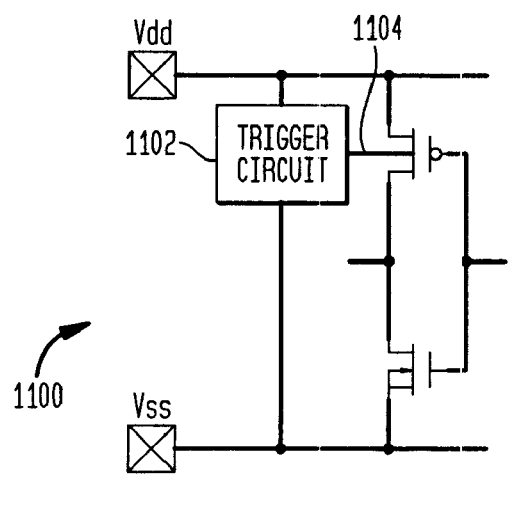
FIG. 11A and FIG. 11B depict an illustrative circuit diagram of the SCR for ESD protection according to an alternate embodiment of the present invention.
Figure 11B:
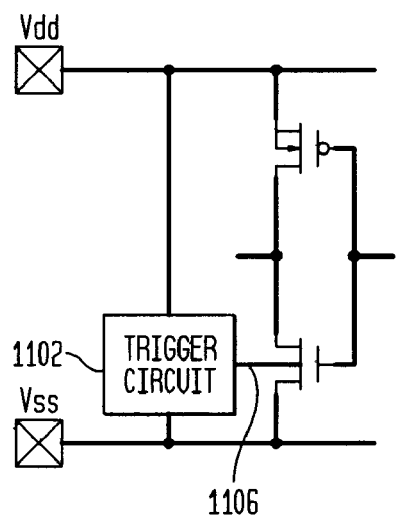
Figure 12B:
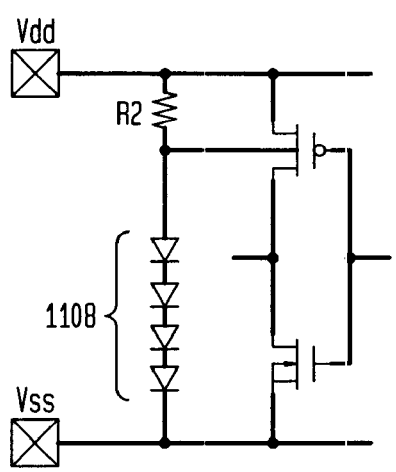
FIG. 12A and FIG. 12B depict an illustrative circuit diagram of an alternate embodiment with reference to FIG. 11A and FIG. 11B respectively.
Figure 12A:
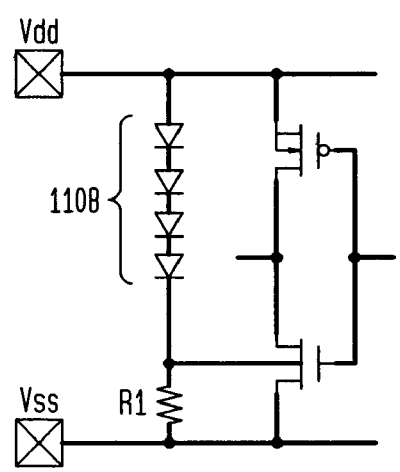

Triggering of the intrinsic SCR can be done by adding a trigger circuit 1102 to the bulk ties of MOS devices as illustrated in the circuit 1100 of FIG. 11. FIG. 11A illustrates adding a trigger circuit 1102 via gate G2 1104 to the PMOS and FIG. 11B illustrates adding a trigger circuit 1102 via gate G1 1106 to the NMOS. In FIG. 12, the trigger circuit 1102 preferably consists of four diodes 1202. However, in general this trigger circuit 1102 can consist of any elements, both passive (diodes, resistors, inductances, capacitances, etc.) and/or active elements (MOS devices, SCRS, etc.). FIG. 12A shows a possible implementation including the trigger circuit 1102 of FIG. 11A with four diodes 1108. FIG. 12B includes the trigger circuit 1102 of FIG. 1B with four diodes 1108. The resistance R2 of FIG. 12A and the resistance R1 of FIG. 12B can preferably be both intrinsic or externally added. The value of these resistances will determine the trigger current of the SCR. Making these resistances small will increase the latch up immunity of the clamp.

An even further embodiment of the present invention can be seen in FIG. 13. FIG. 13 illustrates a cross-section diagram consisting of an SCR 1300 with two anodes 1302 & 1304 and two cathodes 1306 & 1308. It is used in a chip (not shown) with two power domains. The first domain is connected at nodes of a first voltage potential Vdd1 1310 and second voltage potential Vss1 1312. The second domain is connected to nodes of a third voltage potential Vdd2 1314 and a fourth voltage potential Vss2 1316. The first and third voltage potentials Vdd1 1310 and Vdd2 1314 respectively, have equivalent values, preferably connected to a pad of the circuitry (not shown). The second and the fourth voltage potentials Vss1 1312 and Vss2 1316 respectively, have equivalent values, preferably connected to a ground (not shown). When the power clamp activates at one domain, the power clamp at the other domain tends to trigger as well when current is flowing there.

For example, this is especially advantageous for a Charge Device Model (CDM) event. CDM is know in the art as a model used to simulate a kind of ESD-stress. The different power domains on a chip have mostly a different capacitance. This means that during CDM, one domain can discharge faster than another domain. Such situation can possibly cause too much voltage difference between power domains on a chip. Using the invention, the Vdd and Vss line of all domains can be clamped tightly together, preventing too much potential difference between them.

Holding diodes can be added in series with the Vdd1 1310 and/or Vdd2 1314 terminal as desired to raise the holding voltage of the power clamp for a certain power domain. This can be done for each power domain independently. Even though, the present invention shows an embodiment with two power domains as shown in FIG. 13, it can also be applied for chips with more than two power domains.

An even further embodiment of the present invention includes a triggering scheme for triggering of the SCR as shown in cross section diagram 1400 of FIG. 14. Triggering the structure can happen by sending current through the N−well. In order to be able to do this, an N+ region is added to the N− well. The triggering scheme includes the external on-chip triggering device such as a string of two diodes 1402 and 1404 connected in series from the newly created N− well connection to Vss 512. This is similar to the diode triggering scheme of a conventional SCR. When the voltage Vdd 508-Vss 512 reaches about 3 V, the diodes 1402 and 1404 will conduct and current will flow from Vdd 508 to Vss 512 through the P+/N− diode and the two external diodes. This is indicated by dashed line "1" in FIG. 14. The voltage at which current starts to flow is dependent on the number of trigger diodes. The trigger current will forward bias the base of the parasitic transistor in the N− well and thus turn on the SCR between Vdd 508 and Vss 512. Triggering can also happen due to an excess voltage on the PAD 840 with respect to Vss 512 as shown by dashed line "2" in FIG. 14. The same trigger mechanism is applied here, only the other parasitic PNP in the N− well gets forward biased now. The P− substrate is connected to Vss 512 by a resistor 1406 in order to prevent unwanted triggering by substrate noise, etc. Note that this resistor will have influence on the trigger speed of the circuit. A low ohmic resistor will cause slow triggering.

Figure 15A:
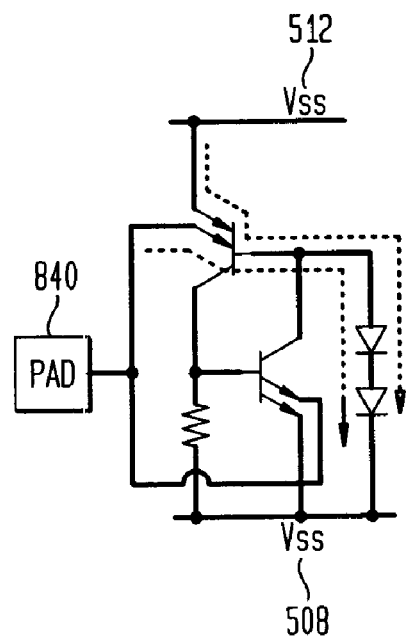
FIG. 15A and FIG. 15B depicts an illustrative circuit diagram of an alternate embodiment with reference to FIG. 14 of the present invention.
Figure 15B:
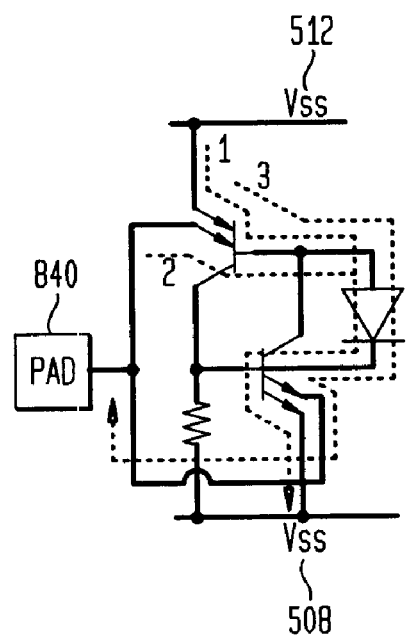

A schematic representation of these triggering paths of FIG. 14 is illustrated in FIG. 15A. The two possible trigger paths marked in dashed line, indicated by "1" and "2". The numbers refer to the same trigger paths as indicated in FIG. 14. FIG. 15B a variation of the trigger scheme as an alternate embodiment of the present invention. Only trigger diode 1502 is added here between the N− well and the P− well of the invention. There are now three possible trigger paths. The first one is for excess voltage between Vdd 508 and Vss 512 and is indicated by "1" similar to FIG. 15A. The second one is indicated by "2" and current will flow here for an over voltage between PAD 840 and Vss 512 similar to FIG. 15A. An additional third trigger path marked with "3" will start to conduct current and trigger the structure for excess voltage between Vdd 508 and PAD 512.

Although various embodiments that incorporate the teachings of the present invention have been shown and described in detail herein, those skilled in the art can readily devise many other varied embodiments that still incorporate these teachings without departing from the spirit and the scope of the invention.

The invention claimed is:

1. An electrostatic discharge (ESD) protection circuit in a semiconductor integrated circuit (IC), the ESD protection circuit comprising:
   at least a first silicon controlled rectifier (SCR) including at least one first anode formed in a first N-type region and at least one first cathode formed in a first P-type region, said first anode coupled to a first voltage potential and said first cathode coupled to a second voltage potential; and
   at least a second silicon controlled rectifier (SCR) including at least one second anode formed in the first N-type region, and at least one second cathode formed in a second P-type region, said second anode coupled to a third voltage potential and said second cathode coupled to a fourth voltage potential, wherein the first SCR is coupled to the second SCR.

2. The circuit of claim 1 wherein the first anode of the first SCR is adjacent to the second anode of the second SCR.

3. The circuit of claim 1 wherein the first cathode of the first SCR is adjacent to the second cathode of the second SCR.

4. The circuit of claim 1 further comprising at least one trigger-tap disposed in the first N-type region.

5. The circuit of claim 1 further comprising at least one trigger tap disposed in at least one of the first P-type region of the first SCR and the second P-type region of the second SCR.

6. The circuit of claim 1 wherein said first anode, said second anode, said first cathode and said second cathode are highly doped regions and said first P-type region, said second P-type region, and said first N-type region are lowly doped regions.

7. The circuit of claim 6 further comprising at least one first boost circuit connected at the third region and at least one second boost circuit connected at the seventh region.

8. The circuit of claim 7 wherein said first and second boost circuits comprises at least one of diode, MOS, resistor, capacitor and inductor.

9. The circuit of claim 7 further comprising at least one first boost circuit connected at the first region and at least one second boost circuit connected at the fifth region of the second anode.

10. The circuit of claim 9 wherein said first and second boost circuits comprises at least one of diode, MOS, resistor, capacitor and inductor.

11. The circuit of claim 1 further comprising:
at least one first trigger-tap disposed proximate to the at least first cathode;
at least one second trigger-tap disposed proximate to the at least second cathode;
and at least one low ohmic connection coupled between said first and second trigger taps.

12. The circuit of claim 11 further comprising a first external on-chip triggering device coupled to the at least first and second trigger taps.

13. The circuit of claim 11 further comprising:
at least one boost circuit connected between the first and the second trigger tap.

14. The circuit of claim 13 wherein said boost circuit comprises at least one of diode, MOS, resistor, capacitor and inductor.

15. The circuit of claim 1 further comprising:
at least one third trigger-tap disposed proximate to the first anode;
at least one fourth trigger-tap disposed proximate to the second anode; and
at least one low ohmic connection coupled between said third and fourth trigger taps.

16. The circuit of claim 15 further comprising a first external on-chip triggering device coupled to the at least third and fourth trigger taps.

17. The circuit of claim 15 further comprising:
at least one boost circuit connected between the first and the second trigger tap.

18. The circuit of claim 17 wherein said boost circuit comprises at least one of diode, MOS, resistor, capacitor and inductor.

19. The circuit of claim 1 wherein the first P-type region of the first SCR is in direct contact with the second P-type region of the second SCR.

20. An electrostatic discharge (ESD) protection circuit in a semiconductor integrated circuit (IC), the ESD protection circuit comprising:
at least a first silicon controlled rectifier (SCR) including at least one first anode formed in a first N-type region and at least one first cathode formed in a first P-type region, said first anode coupled to a first voltage potential and said first cathode coupled to a second voltage potential; and
at least a second silicon controlled rectifier (SCR) including at least one second anode formed in a second N-type region, and at least one second cathode formed in the first P-type region, said second anode coupled to a third voltage potential and said second cathode coupled to a fourth voltage potential, wherein the first SCR is coupled to the second SCR.

21. The circuit of claim 20 wherein the first N-type region of the first SCR is in direct contact with the second N-type region of the second SCR.

22. The circuit of claim 20 wherein the first anode of the first SCR is adjacent to the second anode of the second SCR.

23. The circuit of claim 20 wherein the first cathode of the first SCR is adjacent to the second cathode of the second SCR.

24. The circuit of claim 20 further comprising at least one trigger-tap disposed in at least one of the first N-type region of the first SCR and the second N-type region of the second SCR.

25. The circuit of claim 20 further comprising at least one trigger tap disposed in the first P-type region.

26. The circuit of claim 20 wherein said first anode, said second anode, said first cathode and said second cathode are highly doped regions and said first P-type region, said first N-type region and second N-type region are lowly doped regions.

27. The circuit of claim 20 further comprising:
at least one first trigger-tap disposed proximate to the at least first cathode;
at least one second trigger-tap disposed proximate to the at least second cathode;
and at least one low ohmic connection coupled between said first and second trigger taps.

28. The circuit of claim 27 further comprising a first external on-chip triggering device coupled to the at least first and second trigger taps.

29. The circuit of claim 20 further comprising:
at least one third trigger-tap disposed proximate to the first anode;
at least one fourth trigger-tap disposed proximate to the second anode; and
at least one low ohmic connection coupled between said third and fourth trigger taps.

30. The circuit of claim 29 further comprising a first external on-chip triggering device coupled to the at least third and fourth trigger taps.

* * * * *